(12) United States Patent
Simmons et al.

(10) Patent No.: US 6,654,593 B1
(45) Date of Patent: Nov. 25, 2003

(54) COMBINED DISCRETE AUTOMATIC GAIN CONTROL (AGC) AND DC ESTIMATION

(75) Inventors: Sean Simmons, Waterloo (CA);
Muhammad Dajani, Waterloo (CA);
Zoltan Kemenczy, Mississauga (CA)

(73) Assignee: Research In Motion Limited, Waterloo (CA)

( * ) Notice: Subject to any disclaimer, the term of this patent is extended or adjusted under 35 U.S.C. 154(b) by 577 days.

(21) Appl. No.: 09/699,794

(22) Filed: Oct. 30, 2000

(51) Int. Cl.[7] .............................. H04B 1/06; H04B 7/00
(52) U.S. Cl. ..................... 455/234.1; 455/312; 455/324
(58) Field of Search .......................... 455/234.1, 234.2, 455/245.1, 246.1, 250.1, 296, 303, 309, 310, 312, 317, 324; 375/345

(56) References Cited

U.S. PATENT DOCUMENTS 5,812,025 A * 9/1998 Shimazaki .................. 330/129
5,898,912 A * 4/1999 Heck et al. ............... 455/234.2
6,240,100 B1 * 5/2001 Riordan et al. ............. 370/442
6,321,073 B1 * 11/2001 Luz et al. ................. 455/239.1
6,498,929 B1 * 12/2002 Tsurumi et al. ............. 455/296

* cited by examiner

*Primary Examiner*—Nguyen T. Vo
(74) *Attorney, Agent, or Firm*—Jones Day; Krishna K. Pathiyal, Esq.; Charles B. Meyer, Esq.

(57) ABSTRACT

An automatic gain control (AGC) and DC estimation and correction technique for wireless communication devices is provided. An AGC signal, which controls a gain applied to a received signal by a gain stage to generate a scaled signal, is assigned one of a relatively small number of values in accordance with the amplitude of the scaled signal. An estimate of a DC offset in the scaled signal corresponding to each value of the AGC signal is stored in a memory. A DC estimation arrangement then reads the stored estimate associated with the particular value of the AGC signal from the memory and generates a current DC estimate based thereon. The current estimate is then used to correct the scaled signal for DC offset and to update the stored estimate.

44 Claims, 7 Drawing Sheets

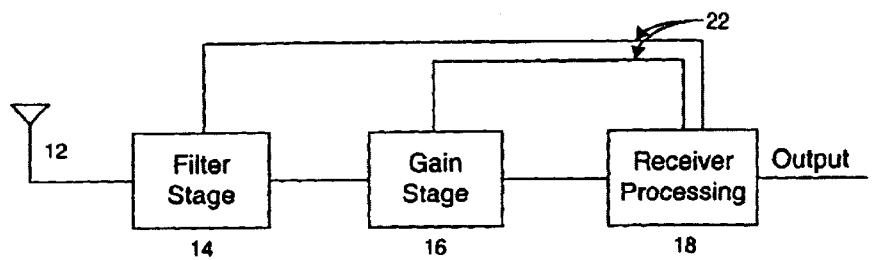
FIG. 1 - PRIOR ART
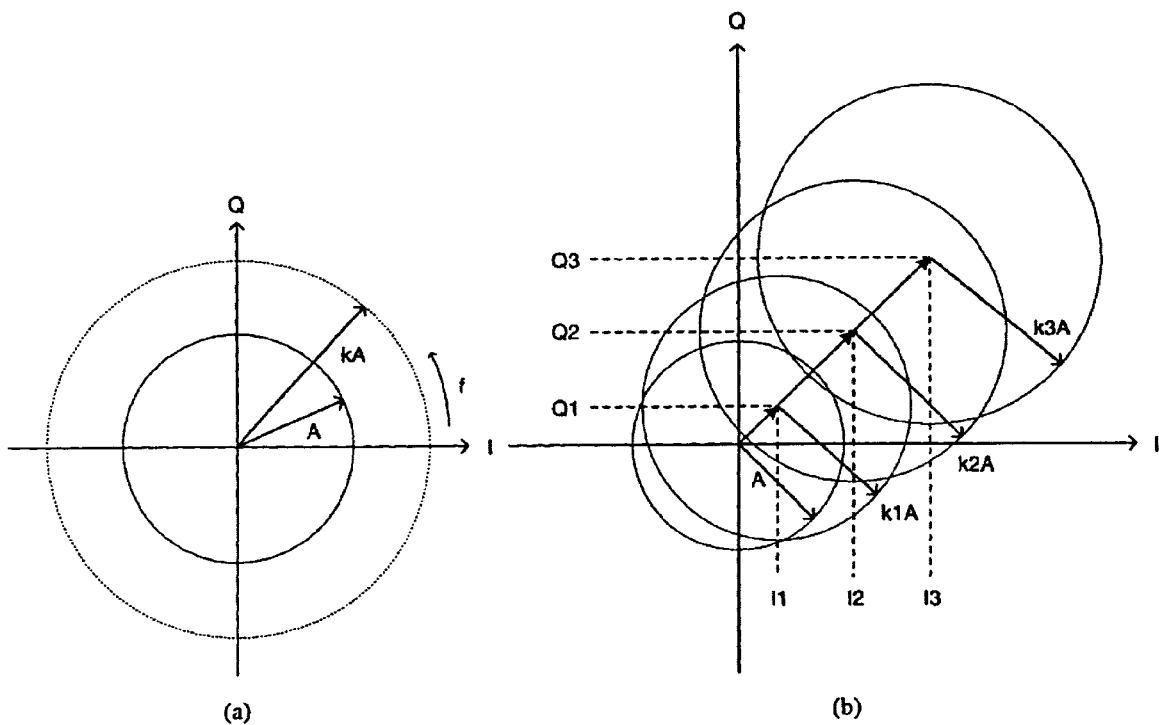
FIG. 3

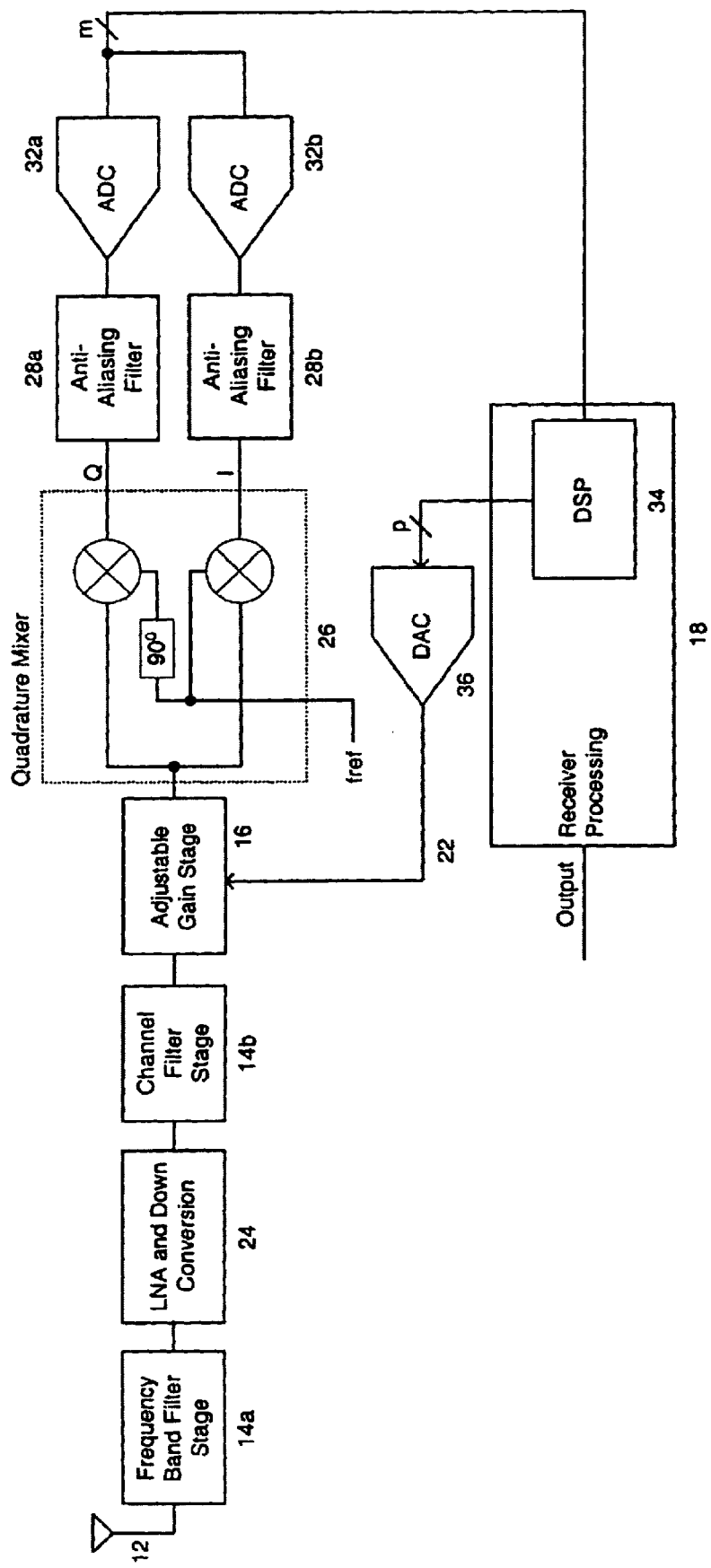
FIG. 2 - PRIOR ART

COMBINED DISCRETE AUTOMATIC GAIN CONTROL (AGC) AND DC ESTIMATION

BACKGROUND

1. Field of the Invention

This invention relates to a radio signal receiver, and particularly to estimation of and removal of direct current (DC) components in received complex base band (CBB) signals.

2. Description of the Related Art

Radio frequency (RF) signal receivers generally share a basic structure 10 as shown in FIG. 1. A signal received by antenna 12 is filtered (14) to separate a signal at a particular desired frequency, normally referred to as a channel, from other components of the received signal. Most RF receivers would also include a gain stage 16, followed by further receiver processing block 18, the nature of which will depend on the particular receiver and its application. Such functions as demodulation, decoding and further signal processing would be included in block 18. Various control signals for the filter and gain stages can be generated by processing block 18 and supplied as inputs to these stages over control signal paths 22.

The receiver 10 is a very general receiver structure and is intended only as an illustration thereof. The implementation of this general structure will vary considerably, depending upon the particular receiver application and manufacturer. For example, different receivers may obviously operate in different frequency bands and detect different channels, leading to differences in filter design. The gain stages of different receivers will also vary, depending for example upon required receiver dynamic range, which will be dependent upon the intended application of the receiver. Different manufacturers may also use different components to realize the various receiver circuits.

FIG. 2 shows a more detailed block diagram of a known radio receiver 20. The receiver 20 includes two filter stages 14a and 14b, roughly corresponding to filter stage 14 of receiver 10. Filters 14a and 14b are both band pass filters, although the bandwidth of channel filter 14b is narrower than that of frequency band filter 14a. Between the filter stages 14a and 14b, receiver 20 includes a low noise amplifier (LNA) and frequency down conversion stage 24 for amplifying the filtered signal from the filter 14a and converting from RF to intermediate frequency (IF). As in receiver 10, receiver 20 includes a gain stage 16, controlled by a gain control signal that is generated by the receiver processing block 18.

The addition of quadrature mixer 26 into the general receiver structure will be obvious to those skilled in the art to which the instant invention pertains. Quadrature mixture 26 separates the in-phase (I) and quadrature (Q) components of the CBB received signal, as shown at the output of mixer 26. Low pass filters 28a and 28b filter out image signal components, from the mixer 26 output, and limit the input bandwidth sampled by the analog to digital converters (ADCs) 32a and 32b. The ADCs 32a and 32b are also included in receiver 20, since most modem receivers perform signal processing functions in the digital domain.

Digital outputs from the ADCs 32a and 32b are input to a digital signal processor (DSP) 34 in the receiver processing block 18. One of the functions of the DSP is to generate automatic gain control (AGC) signals that control the gain stage 16. Since the DSP is a digital component and the gain stage is analog, a digital to analog converter (DAC) 36 is required in control signal path 22.

The gain stage 16 in FIG. 2 is required to ensure that the signals input to each of the ADCs 32a and 32b are within the dynamic operating range of the ADC. If the received amplitude is relatively low, then a relatively large gain is applied in gain stage 16, whereas a relatively small gain is applied when the received signal amplitude is relatively high. This allows the use of lower resolution ADCs than would otherwise be required in order to operate over a full range of expected received signal strengths. Since the cost and power consumption of ADCs increases with resolution, receivers such as receiver 20 with AGC arrangements cost less and consume less power than those without AGC. For example, assuming that receiver 20 is to operate over a range of received signal strengths from −30 dBm to −120 dBm, representing a dynamic range of 90 dB, then in the absence of gain stage 16, the required input dynamic range of the ADCs 32a and 32b would also be 90 dB. In order to operate over this range, a 15-bit ADC would be required. With AGC however, the gain control algorithm used by the DSP 32 can be designed to accommodate virtually any desired ADC dynamic range.

FIG. 3(a) shows a plot of a typical carrier signal in the complex IQ plane. As known to those skilled in the art, such a signal would appear in IQ space as a point following a circular path with radius A, proportional to signal amplitude, at a rotation rate proportional to frequency f. Ideally, the gain stage 16 operates on a signal with amplitude A to apply gain k and thereby generate a signal with amplitude kA. As shown in FIG. 3(a), the original and amplified signals are centred on the origin of the IQ plane. Unfortunately, ideal operating conditions are seldom achieved. Even a pure carrier signal would normally not be exactly centred at the IQ origin in a real system.

In integrated receivers, most of the components shown in FIG. 2 are realized on a single printed circuit board (PCB). This can result in feeding back of signals from circuit components through the PCB to other components. In receiver 20 the fref input to the quadrature mixer 26 can be "picked up" at the input of gain stage 16, causing a DC offset or shift in the centre of the IQ complex signal away from the origin. As the DC offset increases, more error is introduced in the I and Q components, increasing the receiver symbol error rate. Since the I and Q components causing the DC offset are picked up at the gain stage input, the offset increases for higher gains. This effect is shown in FIG. 3(b). For increasing gains k1, k2 and k3, the DC offsets (I1, Q1), (I2, Q2) and (I3, Q3) also increase.

According to a known technique, DC offset in a received signal can be estimated using an averaging filter. The filter is a discrete approximation of an exponential filter and has a transfer function of $(1-c)/(1-cz^{-1})$. For the estimate to be insensitive to variations in the CBB spectrum, c is chosen such that the time constant is several times less than the smallest spectral component. A major disadvantage of this known technique for radio modems is that the filter has a long time constant relative to the symbol rate (usually several thousand symbols) and therefore responds slowly when the DC offset changes due to AGC changes as shown in FIG. 3(b). Every time a new gain is applied in gain stage 16, typically several thousand symbols are received before the DC offset estimate from the averaging filter is accurate.

In mobile communication environments, particularly in fading conditions wherein received signal levels fluctuate rapidly and thus the gains applied in gain stage 16 must be changed relatively often, receiver performance degrades severely because the DC estimation filter cannot quickly track the DC offset changes due to AGC changes. Some mobile communications systems also use intermittently keyed base stations, which further exacerbates the DC offset estimation problem. In such systems, a received signal can quickly change from very low amplitude noise signal, to which high gain will be applied in gain stage 16, to a high amplitude signal, to which a low gain will be applied. This switching between very different gains and very different resultant DC offsets results in increased errors when the gain is changed, such that sensitivity for detection of such intermittently keyed base stations is drastically reduced.

SUMMARY

A wireless communications receiver is provided that comprises means for applying a gain to a received signal, responsive to an AGC signal, to produce a scaled signal; AGC means for determining amplitude of the scaled signal and generating the AGC signal; and means for estimating a DC offset of the scaled signal, wherein the means for estimating the DC offset reads a previously estimated and stored DC offset value from a memory means.

A gain control and DC offset estimation method according to one embodiment of the invention comprises the steps of applying a gain to a received signal, responsive to an AGC signal, to produce a scaled signal; determining amplitude of the scaled signal; generating the AGC signal based on the amplitude of the scaled signal and an AGC algorithm; estimating a DC offset of the scaled signal to generate an estimate; and updating a storage location in a memory means with the estimate, wherein the step of estimating the DC offset comprises a step of reading a previously stored estimate from the memory means.

Embodiments of the invention may also be embodied in a software program stored on a computer-readable medium, which when executed by a processor in a receiver performs the method steps of providing an AGC signal to a gain stage in the receiver to control a gain applied to the received signal, the gain stage producing a scaled signal; determining an amplitude of the scaled signal; generating the AGC signal based on the amplitude of the scaled signal and an AGC algorithm; estimating a DC offset of the scaled signal to generate an estimate; and updating a storage location in a memory means with the estimate, wherein the step of estimating the DC offset comprises a step of reading from the memory means a previously stored estimate corresponding to the value of the AGC signal.

Another aspect of the invention provides a wireless communications receiver comprising an antenna for receiving a communication signal, a receiver front end comprising means for filtering, amplifying and down-converting the communication signal received by the antenna, means for applying a gain to the signal output by the receiver front end to produce a scaled signal, the particular applied gain being controlled by an AGC signal, in-phase (I) and quadrature (Q) signal component processing means for separating the I and Q components of the scaled signal, and ADC means for converting the separated I and Q components to digital signals, the invention may be implemented in a DSP comprising AGC means for determining amplitude of the I and Q components and generating the AGC signal, and means for estimating a DC offset of the I and Q components to generate a DC offset estimate, wherein the means for estimating the DC offset reads a previously stored DC offset estimate from a memory means.

The AGC signal has a finite number of possible values, and the memory means stores a previously estimated DC offset corresponding to each possible value of the AGC signal. In one embodiment, the memory stores a unique estimate corresponding to each possible value of the AGC signal, whereas in an alternate embodiment, the number of DC offset estimates stored in the memory means is less than the finite number of possible values of the AGC signal, such that at least one of the stored DC offset estimates corresponds to more than one of the values of the AGC signal.

The disclosed AGC scheme operates to maintain a scaled signal output from a controlled gain stage within a desired dynamic range when a received signal is within the dynamic range of the receiver. The invention also preferably removes DC offset from the scaled signal using the estimated DC offset.

Implementation of the invention in hardware, software or a combination of both, such as in a DSP, is contemplated.

The present invention is preferably configured to operate in conjunction with wireless modems, wireless hand-held communication devices, personal digital assistants (PDAs), cellular phones, two-way pagers and other wireless communication devices and systems, as well as many other types of systems.

Further features of the invention will be described or will become apparent in the course of the following detailed description.

BRIEF DESCRIPTION OF THE DRAWINGS

In order that the invention may be more clearly understood, preferred embodiments thereof will now be described in detail by way of example, with reference to the accompanying drawings, in which:

FIG. 1 is a simple block diagram of a typical prior art receiver;

FIG. 2 is a block diagram of a further known receiver;

FIGS. 3(a) and 3(b) show signal plots on the IQ complex plane;

DETAILED DESCRIPTION OF THE DRAWINGS

Figure 4:
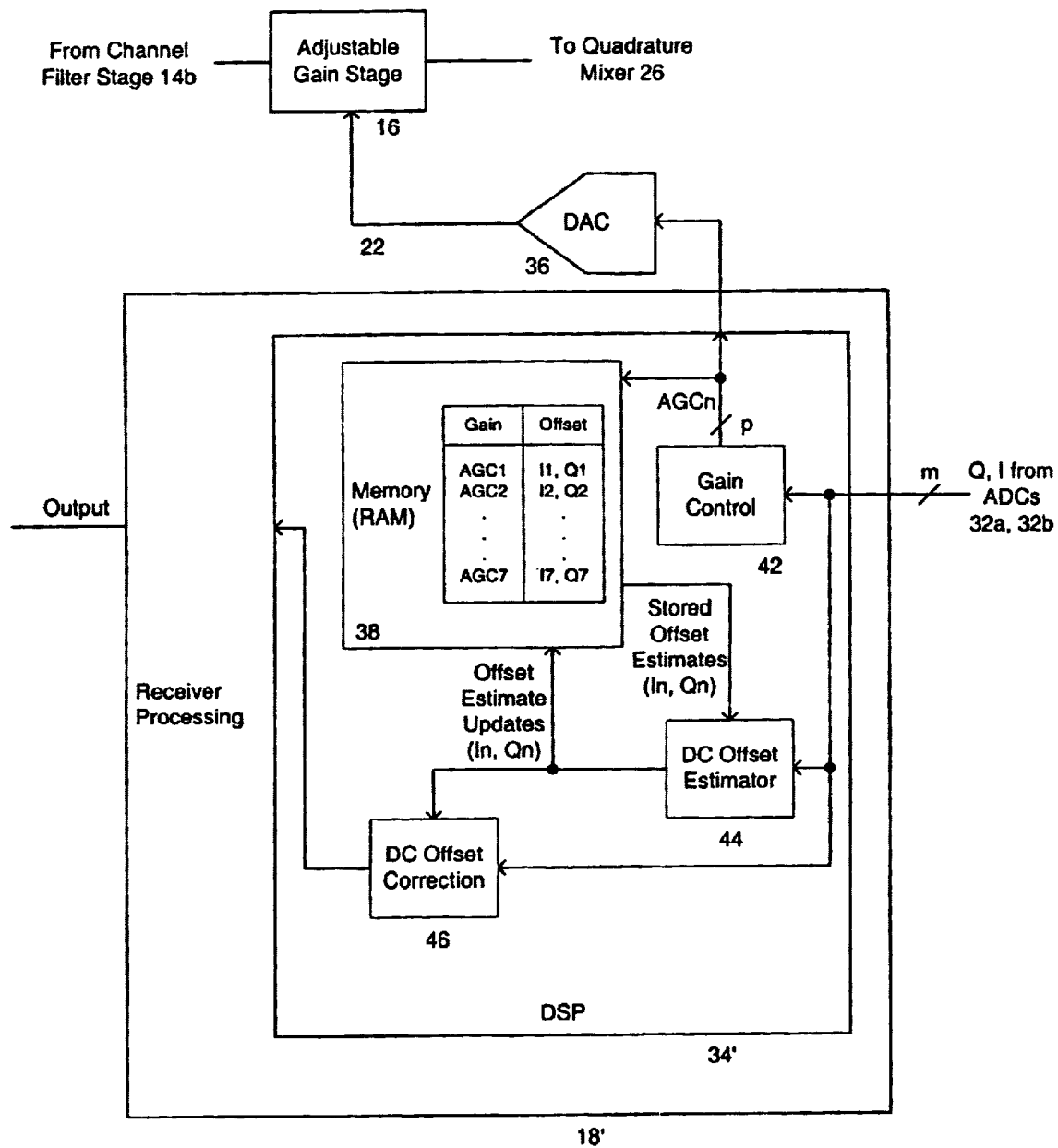
FIG. 4 is a block diagram of a preferred embodiment of the invention.

FIG. 4 shows a preferred embodiment of the invention. Since the invention primarily involves the gain control and DC estimation functions of the receiver, FIG. 4 shows only the components involved in these functions.

As will be apparent to those skilled in the art, gain control 42 determines the amplitude of the I and Q components of a received signal and, in accordance with an AGC algorithm, determines a gain to be applied at gain stage 16. A corresponding p-bit AGC value or gain setting, AGCn, is output to DAC 36 and converted to an analog value that controls the gain applied by gain stage 16. Each value AGCn is mapped to a corresponding gain value in the gain stage 16. This general gain control technique is essentially the same as used in known AGC arrangements.

The specific AGC algorithm chosen will depend upon the desired resolution and operating ranges of the ADCs 32a and 32b. For example, a 10-bit ADC can operate over a range of $20 \times \log_{10}(2^{10}) = 60.2$ dB, which would require at least one gain change in order to provide for the above example 90 dB receiver dynamic range (between −120 dBm and −30 dBm).

Conventional AGC algorithms normally assign minimum and maximum gains depending upon the desired receiver and ADC dynamic ranges and provide for gain steps between the minimum and maximum values. The gain step size is typically relatively small (less than 3 dB) to provide an approximation to a "continuous" AGC transfer function. Such continuous AGC results in frequent gain changes, such that the associated DC offset in the received signal also frequently changes. Thus, a single DC estimator producing a single DC estimate for all gains, as is common in known systems, is problematic.

In an embodiment of the instant invention, both the AGC algorithm and the DC estimation technique depart from the prior art. As discussed below, AGC gain settings are "discretized" and estimated DC offsets corresponding to each discrete gain setting are stored in a memory.

The disclosed discrete AGC technique limits the number of possible AGC gain settings and thereby reduces the frequency of gain and resultant DC offset changes. The AGC algorithm maintains the received signal within the dynamic range of the ADCs, yet the gain is changed much less frequently relative to continuous AGC algorithms. Limiting the number of possible gain settings also makes memory storage of estimated DC offset values corresponding to each gain setting feasible. Such storage of DC estimates in conjunction with continuous AGC would require substantial memory space, which would increase cost, size and power consumption of the receiver. Also, if the number of DC estimates is large, it would take a long time to acquire initial estimates.

Referring again to FIG. 4, the gain control functional block 42, which embodies the AGC algorithm, determines which one of the gain settings AGCn should be used, dependent upon the I and Q samples from the ADCs and the AGC algorithm. The gain setting AGCn is provided not only to the DAC 36 for input to the gain stage 16 as in the prior art, but also to a random access memory (RAM) 38.

A table of gain settings, seven in the example shown in FIG. 4, and corresponding DC estimates is stored in RAM 38. In the invention, the gain setting/estimate table in RAM 38 is accessed using a gain setting AGCn and outputs a stored estimated DC offset to the DC estimator 44. The DC estimate provided by RAM 38 is a current DC offset estimate or average for the particular gain setting and determines a state of the DC estimator 44. As discussed above, DC estimation is typically accomplished using a long time constant averaging filter as the estimator 44, although other implementations are possible and are contemplated within the scope of the invention. The DC offset correction functional block 46 uses the DC offset estimates generated by the estimator 44 to correct for the DC offset present in the received signal (i.e., by subtracting the average (DC) from the input signal) and outputs corrected signals for further processing in the receiver.

The operation of the inventive gain control and DC estimation technique will now be described with reference to FIG. 4. By way of example only, assume a worst-case scenario corresponding to an intermittently keyed base station as discussed above. When the base station is off, the antenna would be receiving low amplitude noise and gain stage 16 would therefore apply a high gain to the received signal, corresponding to a gain setting of AGC1 for example. In accordance with the inventive gain control and DC estimation technique, when the base station is keyed on, the gain control 42 determines that the high amplitude of the received signal necessitates a gain change to a much lower value, for example the lowest gain corresponding to gain setting AGC7. The new gain setting AGC7 is provided to both the DAC 36 to effect the gain change at gain stage 16 and to the RAM 38 to access the gain setting/estimate table. Although FIG. 4 shows AGCn being input to the memory from gain control block 42, it may also be provided to the estimator 44, which would then use the AGC gain setting to access the table in RAM 38.

RAM 38 provides previously stored DC offset estimates to the estimator 44. In the example scenario, AGC7 is provided to RAM 38, which outputs the corresponding stored estimates I7 and Q7 to the estimator 44. These stored estimates from RAM 38, as discussed briefly above and in more detail below, can be used to set the state of the estimator 44. The estimator 44, which in prior art receivers would typically require several thousand symbol periods to proceed from the previous offset estimate (I1, Q1) corresponding to AGC1 to eventually arrive at a new accurate offset estimate, is provided with stored previously estimated values (I7, Q7) which will be closer to the new actual offset at the new gain corresponding to AGC7. Thus, in the inventive system, the estimator 44 essentially "starts" closer to the new DC offset, based on the DC offset estimated when the receiver previously used the new gain. Intermittently keyed base stations therefore cause fewer problems for receivers using the inventive AGC and DC estimation scheme.

While a particular gain is applied in gain stage 16, the estimator 44 continues to estimate the DC offset and updates the table in RAM 38. The gain setting/estimate table therefore stores the most recent offset estimates for each AGC gain setting. In the preceding example, as long as AGC7 is maintained, the stored estimate (I7, Q7) corresponding to AGC7 is continually updated by estimator 44. The next time the gain control switches to AGC value AGC7 from another AGC value, the last updated values of I7 and Q7 will be used in estimator 44.

Figure 5:
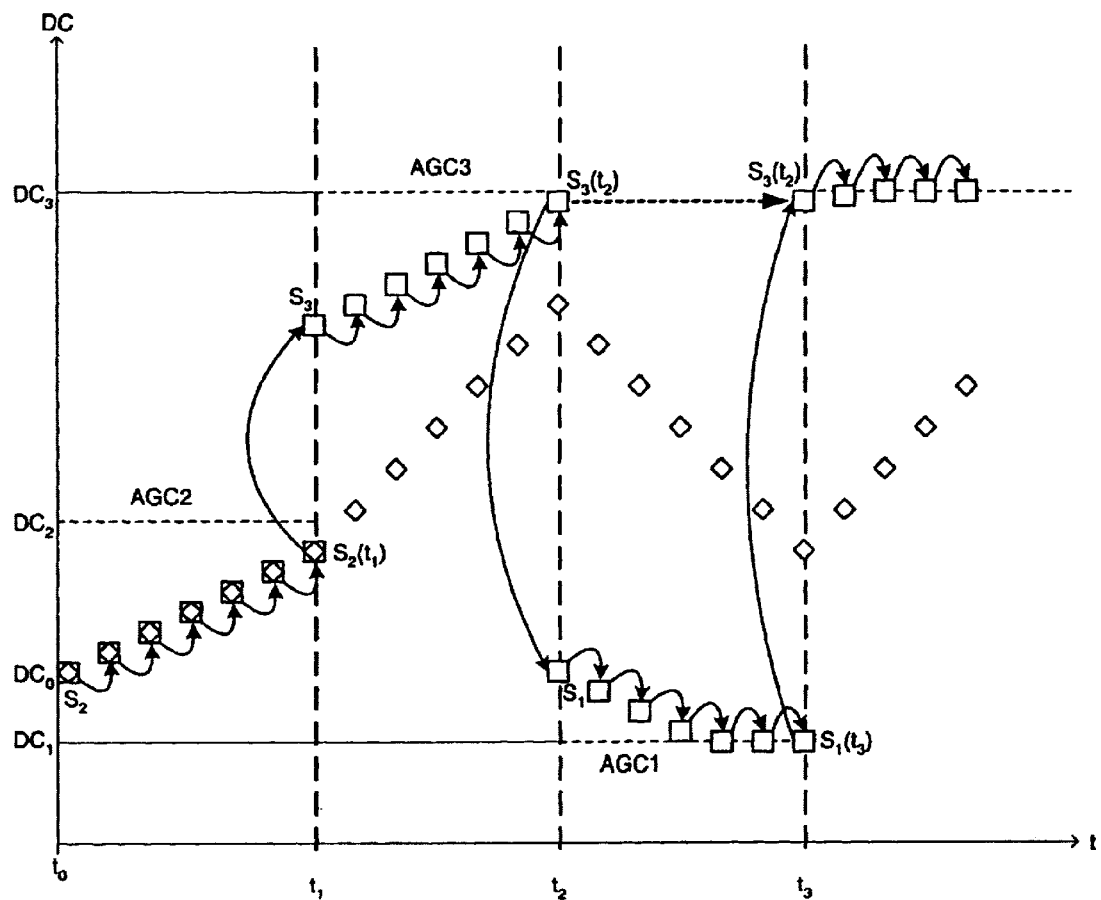
FIG. 5 is a timing diagram illustrating the operation of the inventive gain control and DC estimation scheme relative to prior art techniques.

The operation of both the preferred embodiment of the invention and single-estimate prior art systems is illustrated in FIG. 5. In the Figure, the "squares" represent instantaneous DC estimator outputs for the inventive AGC/estimation system, whereas the "diamonds" represent DC estimates for a prior art system. The exact time (horizontal) and DC (vertical) spacing of the estimates will depend on the particular estimation scheme. For the purpose of clarity in FIG. 5, time spacing of DC estimates for both the inventive and prior art systems is assumed to be the same. In addition, the initial seed values used by both systems are assumed equal. In FIG. 5, transitions between only three (AGC1, AGC2 and AGC3) of the possible seven gain settings in the discrete AGC system of FIG. 4 are shown. It will be obvious that actual system operations may entail transitions between other or different gain settings. However, operation of an embodiment of the invention for such other gain setting changes will be similar.

Each AGC setting has a corresponding DC offset associated therewith. At time $t_0$, it is assumed that the gain setting AGC2 is used. The estimator is provided with a stored estimate $S_2 = DC_0$ from a memory, RAM 38 for example, and the prior art estimator is intialized with the same value $DC_0$. As described above, DC estimators are designed to exhibit relatively long time constants to avoid responding to rapid fluctuations in actual DC offset. Therefore, both systems operate as shown in FIG. 5 to gradually respond to the difference between the actual DC offset $DC_2$ and the current estimate to thereby improve the accuracy of the DC estimate. The short arrows between estimates generated by the inventive system represent the memory update function described above. The feedback loop between the estimator 44 and RAM 38 in FIG. 4 and the associated update function ensure that the most recent DC estimates are stored in RAM 38. At time $t_1$, the gain setting/estimate table location corresponding to gain setting AGC2 has been updated to the DC estimate at time $t_1$, denoted by $S_2(t_1)$.

Also at time $t_1$, it is assumed that received signal conditions and the AGC algorithm dictate a gain setting change from AGC2 to AGC3, which new gain setting has a different associated DC offset. The prior art system merely continues the DC estimation process based on the estimate at time $t_1$, as shown. However, in the inventive system, a stored DC estimate $S_3$ corresponding to the gain setting AGC3 is retrieved from the gain setting/estimate table in RAM 38 and supplied to the estimator 44. The stored estimate $S_3$ for AGC3 is then updated as long as the gain setting AGC3 is used.

A further gain setting change is assumed at time $t_2$. As above, a stored estimate $S_1$ corresponding to the new gain setting AGC1 is retrieved from RAM 38 in accordance with the invention. The stored estimate is then updated during the time that gain setting AGC1 is maintained. When the gain setting is again changed at time $t_3$, the stored estimate $S_1(t_3)$ is a very accurate estimate of the actual DC offset associated with gain setting AGC1. Thus, the next time gain AGC1 is used, the DC estimator 44 in a system according to the invention will be supplied with an accurate stored DC estimate.

As shown at time $t_3$ in FIG. 5, when the gain setting is changed to a previously used gain setting such as AGC3, the most recent DC estimate generated when the gain setting was previously used, which should be an accurate estimate, is retrieved from memory. Therefore, storing DC estimates in memory, retrieving the estimates for use in subsequent DC estimation and updating the stored estimates according to the invention can substantially improve receiver DC estimation and thus correction, as shown clearly in FIG. 5.

Over time, the system will develop accurate DC estimates for all gain settings and store such estimates in memory. Upon subsequent switching to any of the gain settings, the accurate estimates can be retrieved from memory and will continue to be updated. If the actual DC offsets associated with the gain settings change, due to temperature fluctuations for example, then the stored estimate updating function maintains accuracy of the stored estimates.

Figure 6:
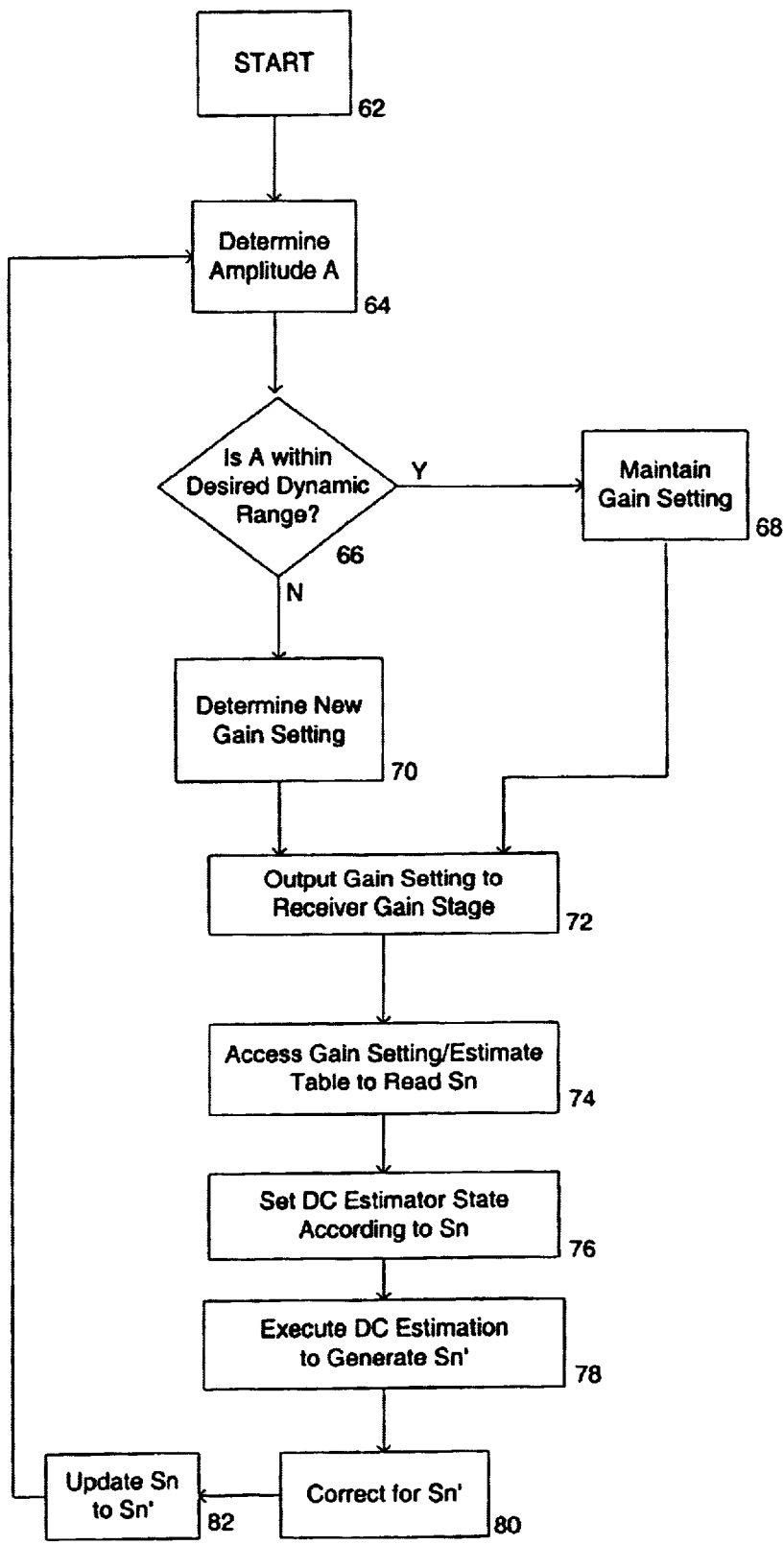
FIG. 6 is a flow chart representing the operation of the invention.

The operation of the preferred embodiment of the invention is further illustrated in flowchart form in FIG. 6. The process begins (62) when a signal is received. At a step 64, the amplitude A of a scaled signal output from a gain stage such as the gain stage 16 in the receiver 40 of FIG. 4 is determined. Step 66 is then executed to determine if the scaled signal is within the desired dynamic range. As will be apparent to those skilled in the art, step 66 will depend upon the particular AGC algorithm used in the receiver. If the scaled signal is within the desired dynamic range, then the current gain setting is maintained (68). If not, a new gain setting is determined at step 70.

The current gain setting, whether a previous setting (step 68) or a new setting (step 70) is output to the gain stage at step 72 to control the gain applied to received signals. The current gain setting is also used at step 74 to access the appropriate location in the gain setting/estimate table to read a stored DC estimate $S_n$ therefrom. At step 76, the state of the DC estimator is set according the stored estimate $S_n$ read from the table, as described above. Subsequent execution of the DC estimation algorithm in step 78 generates a current estimate $S_n'$. The current estimate is used to correct the scaled signal for DC offset, as indicated at step 80. The stored estimate $S_n$ is then updated to $S_n'$ at step 82 and the process is repeated, starting at step 62. This process 60 will continue for the duration of a received signal, but may also be invoked by some other trigger. For example, the receiver may generate a control signal to execute the process 60 for the purposes of determining initial DC estimates when the receiver is first powered on, as described in more detail below.

When the receiver is first powered on, the gain setting/estimate table may be empty, such that the receiver operates similarly to prior art receivers to estimate actual DC offsets. As the gain control switches between the different AGC gain settings, the table is gradually populated and updated as described above. When the gain setting/estimate table has been updated with offset estimates, the performance of the receiver with respect to DC estimation and correction will be substantially better than prior art receivers. Note that the table need not necessarily be complete before receiver performance improves. DC estimation will be more accurate whenever the gain control reverts to any previously used gain setting for which DC estimates were generated, as at time $t_3$ in FIG. 5 for example.

Initial startup generation of the DC estimates for the gain setting/estimate table is preferably required only when the receiver is first powered on. If the receiver is shut down, any existing gain setting/estimate table entries would be stored to a non-volatile storage medium in the receiver.

Alternatively, initial DC estimates may be stored in the gain setting/estimate table to be used as seed values for initial receiver operation, in order to avoid generation of offset estimates in accordance with the prior art estimation techniques. In a preferred embodiment of the invention, when a receiver is initially powered on, it is tuned to random channels and DC offset is estimated for particular gain settings. If multiple estimates for the same gain setting are consistent, within a predetermined acceptable margin of error, then either one of the estimates or an average thereof is stored to the corresponding location in the gain setting/estimate table as the initial startup DC estimate. The initial estimates would then be updated as described above during subsequent receiver operation. The initial estimation function may use a different DC estimator than that used during normal receiver operation. The above initial estimation is merely an illustrative example; the invention is in no way restricted thereto. Operation of the invention is independent of the initial estimate generation technique.

Figure 7:
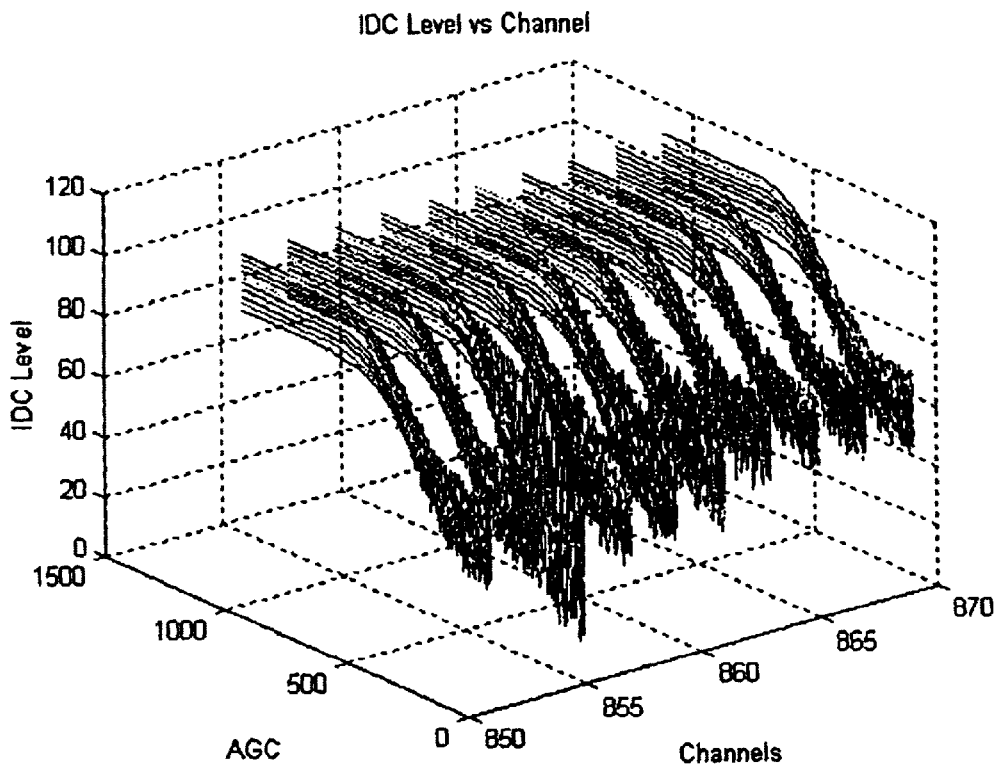
FIG. 7 shows a plot of DC offset level for in-phase (I) components of a received signal for different receive channels and gains.
Figure 8:
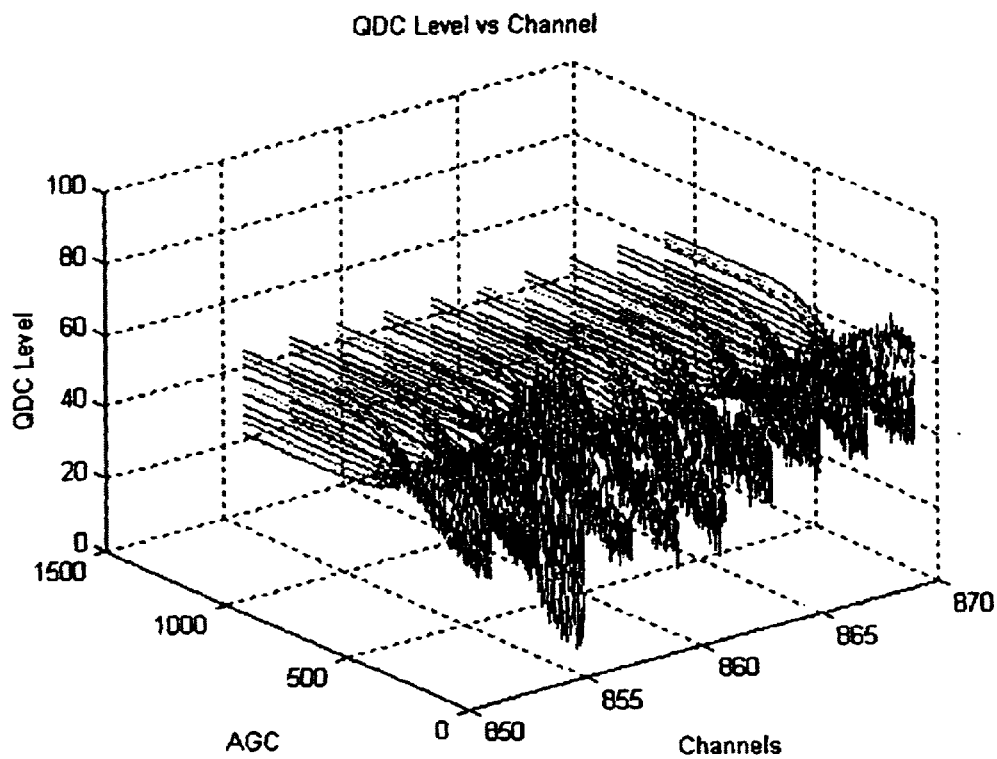
FIG. 8 is a plot similar to FIG. 5, but shows DC offset for quadrature (Q) components.
Figure 9:
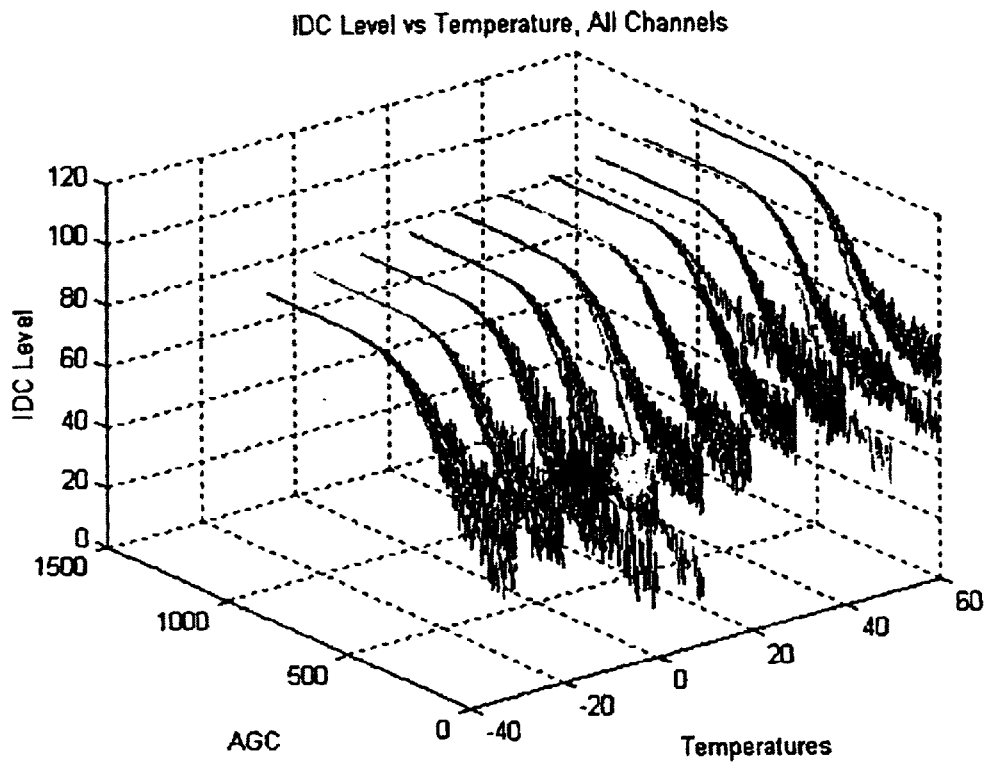
FIG. 9 illustrates IDC offset levels relative to temperature and gain.
Figure 10:
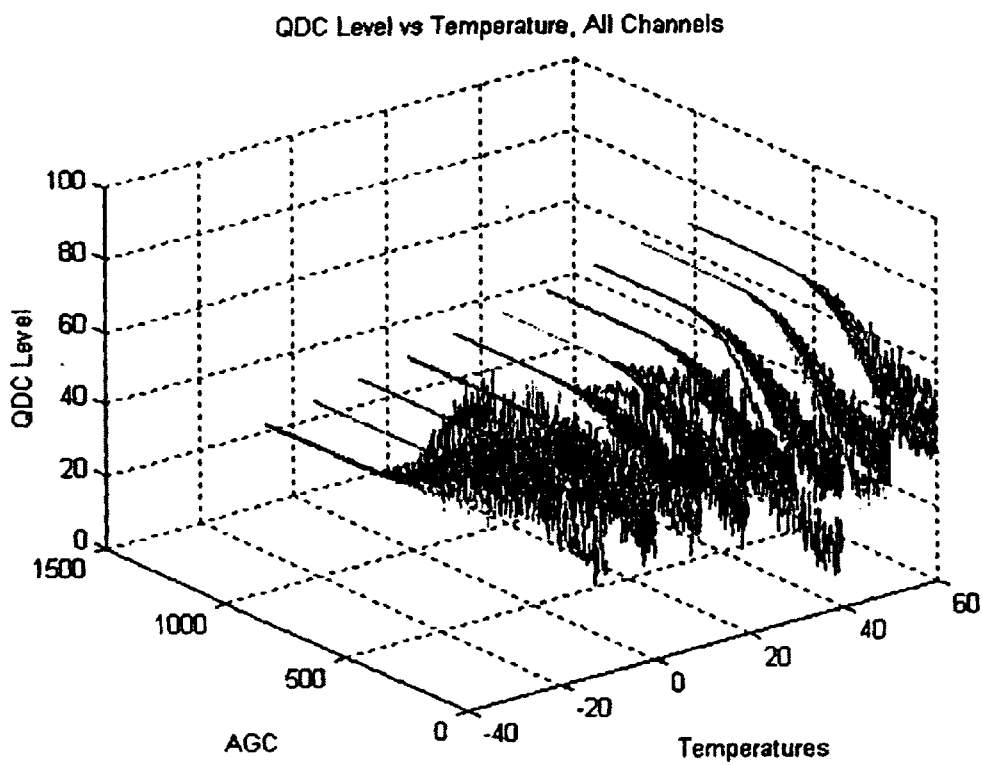
FIG. 10 is similar to FIG. 7, showing QDC offset levels.

Such initial offset estimates would likely improve initial DC offset estimation performance, but might not be suitable for subsequent receiver operation. As shown in FIGS. 7 through 10, DC offset for both the I and Q components varies by channel and temperature. In FIGS. 7 and 8, each 'vertical' set of lines represents a plot of DC levels for a specific channel. Each line in these sets represents a specific temperature. FIGS. 9 and 10 illustrate the same information as in FIGS. 7 and 8 in a different format. FIGS. 7 and 8 show sets of lines grouped by channel, whereas in FIGS. 9 and 10, the sets of lines are grouped by temperature.

It should be apparent from these plots that DC offset varies considerably over temperature and channel. The gain setting/estimate table therefore cannot be pre-programmed for all contemplated temperature and channel conditions, particularly in receivers intended for mobile communication devices, in which channels and temperatures can change frequently. The amount of storage space that would be necessary to accommodate such a large amount of data would preclude such manufacturer calibration of the gain setting/estimate table. The channel and temperature dependence of DC offset would also require some type of channel indicator and temperature measurement input to the memory, in addition to the gain setting memory input, in order to access the correct table entry. The estimation of offsets during receiver operation and subsequent updating of the gain setting/estimate table in accordance with the invention provides for adaptive DC estimation. As operating conditions change, the gain setting/estimate table is updated automatically.

The gain setting/estimate table in RAM 38 of FIG. 4 shows seven AGC values and seven corresponding sets of DC estimates. These particular numbers of AGC and estimates are merely illustrative of the invention, which is in no way dependent thereon. Other numbers of gain settings and estimates could obviously be used and would be chosen in accordance with the intended application of the receiver.

In a contemplated illustrative though non-limiting embodiment of the invention, a receiver is required to operate with received signals in the range of −110 dBm to −40 dBm. This range could for example be split into six ranges, (−110, −90), (−90, −80), (−80, −70), (−70, −60), (−60, −50) and (−50, −40). Assuming that 10-bit ADCs (60.2 dB dynamic range) are to be used and that the desired operating range of the ADC is from 40 dB to 50 dB out of the total 60.2 dB range, the AGC algorithm is designed to map the highest boundary value of each of the six ranges to 50 dB. The upper margin from 50 dB to 60 dB is provided to accommodate strong interferers, whereas the lower margin from 0 dB to 40 dB allows for a fading margin. Under these assumed conditions, the required gains (in dB) will be 140 for the lowest (−110, −90) range, 130 for the range (−90, −80), 120 for the range (−80, −70), 110 for the range (−70, −60), 100 for the range (−60, −50) and 90 for the range (−50, −40). Therefore, six AGC gain settings, one for each of the gains, would be required in this implementation. These example gains are within a 50 dB range, from 90 dB to 140 dB, such that a 10-bit DAC could be used for DAC 36. Determining the correspondence between AGC gain settings and actual gain values is assumed to be performed in the gain stage 16 in receiver 40, although this function could instead be performed in the DSP. As stated above, the invention is not limited to this AGC and gain setting scheme. Other gain settings are also possible and will be obvious to those skilled in the art.

When switching between low gains, the corresponding changes in actual DC offset can be small. This allows for further memory space savings in that the same stored DC estimate can be used for more than one gain setting. In the resulting gain setting/estimate table, more than one gain setting would be associated with a single DC estimate. Referring to FIG. 4 for example, both AGC1 and AGC2, assumed to correspond to the lowest gains, could point to the table entry (I2, Q2). As discussed above, any memory savings can reduce the size and power consumption of the receiver, which can be especially important in mobile communications devices. Using a common single DC estimate for more than one gain setting could somewhat decrease the performance of the invention relative to implementations in which each gain setting has a corresponding unique stored estimate.

However, the common stored DC estimate would still provide for improved DC estimation performance relative to prior art receivers, particularly when the gain is switched from a high level to a low level.

Although described in the context of a particular receiver architecture, the gain control and DC estimation technique described herein may be applied to virtually any wireless communications device in which an AGC is required or desired and DC offset must be compensated or corrected. Wireless modems such as those disclosed in U.S. Pat. No. 5,619,531, titled "Wireless Radio Modem with Minimal Interdevice RF Interference", issued on Apr. 8, 1997, and U.S. Pat. No. 5,764,693, titled "Wireless Radio Modem with Minimal Inter-Device RF Interference", issued on Jun. 9, 1998, both assigned to the assignee of the instant invention, represent types of communication devices in which the invention may be implemented. The disclosures of these patents are incorporated herein by reference.

Mobile wireless communications devices may experience rapid and pronounced fading and thus tend to require frequent gain switching. Improved DC estimation and correction is of particular importance in such mobile devices. The instant invention provides for more accurate DC estimation and correction while requiring few additional receiver components and relatively little additional power. As such, in further preferred embodiments the invention may be configured to operate in conjunction with small mobile communication devices having limited space, power and storage, such as those disclosed in co-pending U.S. patent application Ser. No. 09/106,585 titled "Hand-Held Electronic Device With a Keyboard Optimized for Use With The Thumbs", the disclosure of which is hereby incorporated into this disclosure by reference. Other systems and devices in which the invention may be implemented include, but are not limited to, further fixed or mobile wireless communication systems, wireless hand-held communication devices, personal digital assistants (PDAs) with wireless communication functions, cellular phones and two-way pagers.

It will be appreciated that the above description relates to preferred embodiments by way of example only. Many variations on the invention will be obvious to those knowledgeable in the field, and such obvious variations are within the scope of the invention as described and claimed, whether or not expressly described.

For example, as discussed above, the invention is not restricted to the particular receiver architecture 40. Also, although described as part of a DSP and implemented primarily in software in preferred embodiments, the inventive technique may also be at least partially implemented in hardware.

We claim:

1. A wireless communications receiver, comprising:
   (a) means for applying a gain to a received signal, responsive to an automatic gain control (AGC) signal, to produce a scaled signal;
   (b) AGC means for determining amplitude of the scaled signal and generating the AGC signal; and (c) means for estimating a DC offset of the scaled signal comprising an exponential filter the state of which is set using a previously stored DC offset estimate read from a memory means.

2. A wireless receiver according to claim 1, wherein the AGC signal has a finite number of possible values.

3. A wireless receiver according to claim 2, wherein the memory means stores a DC offset estimate corresponding to each possible value of the AGC signal.

4. A wireless receiver according to claim 3, wherein the number of DC offset estimates stored in the memory means is less than the finite number of possible values of the AGC signal, such that at least one of the stored DC offset estimates corresponds to more than one of the values of the AGC signal.

5. A wireless receiver according to claim 2, further comprising an analog to digital converter (ADC) for converting the scaled signal to a digital signal, wherein the receiver operates for received signals within a receiver dynamic range, the ADC operates on input signals within an ADC dynamic range and the possible values of the AGC signal are selected such that received signals within the receiver dynamic range are converted to scaled signals within the ADC dynamic range.

6. A wireless receiver according to claim 5, wherein the possible values of the AGC signal are selected such that received signals within the receiver dynamic range are converted to scaled signals within a desired ADC operating range, the desired ADC operating range being smaller than and within the ADC dynamic range.

7. A wireless receiver according to claim 1, further comprising means for removing DC offset from the scaled signal using the DC offset estimated by the means for estimating.

8. A wireless receiver according to claim 7, wherein the AGC means, the means for estimating the DC offset of the scaled signal and the means for removing DC offset from the scaled signal are implemented as software in a digital signal processor (DSP).

9. A wireless receiver according to claim 1, implemented in a wireless modem.

10. A wireless receiver according to claim 1, implemented in a mobile communication device.

11. A wireless receiver according to claim 10, wherein the mobile communication device is a cellular telephone.

12. A wireless receiver according to claim 10, wherein the mobile communication device is a two-way pager.

13. A wireless receiver according to claim 10, wherein the mobile communication device is a PDA.

14. A wireless receiver according to claim 10, wherein the mobile communication device is an Internet appliance.

15. A wireless receiver according to claim 1, implemented in an electronic device having means for short-range wireless communications.

16. In a wireless communication receiver, a gain control and DC offset estimation method comprising the steps of:

(a) applying a gain to a received signal, responsive to an automatic gain control (AGC) signal, to produce a scaled signal;

(b) determining an amplitude of the scaled signal;

(c) generating the AGC signal based on the amplitude of the scaled signal and an AGC algorithm, the AGC algorithm assigning one of a finite number of possible values to the AGC signal;

(d) estimating a DC offset of the scaled signal to generate an estimate; and (e) updating a storage location in a memory means with the estimate, wherein the step of estimating the DC offset comprises a step of reading a previously stored estimate from the memory means and using the previously stored estimate to set the state of an exponential filter in order to estimate the DC offset of the scaled signal.

17. A method according to claim 16, wherein the step of reading from the memory means reads from a unique location of the memory means for each possible value of the AGC signal.

18. A method according to claim 16, wherein the step of reading from the memory means reads from a single common memory location of the memory means for at least two of the possible values of the AGC signal, such that at least one of the stored estimates corresponds to more than one of the values of the AGC signal.

19. A method according to claim 16, wherein the values of the AGC signal are selected such that the step of applying the gain to the received signal maintains the scaled signal within a desired dynamic range.

20. A method according to claim 16, further comprising a step of removing DC offset from the scaled signal using the estimate generated in step (d).

21. A method according to claim 16, implemented as software in a digital signal processor (DSP).

22. A method according to claim 21, implemented in a wireless modem.

23. A method according to claim 21, implemented in a cellular phone.

24. A method according to claim 21, implemented in a two-way pager.

25. A method according to claim 21, implemented in an Internet appliance.

26. A method according to claim 21, implemented in an electronic device having means for short-range communication.

27. A method according to claim 21, implemented in a wireless hand-held communication device.

28. In a wireless communications receiver, a software program stored on a computer-readable medium, which when executed by a processor in the receiver performs the method steps of:

(a) providing an automatic gain control (AGC) signal to a gain stage in the receiver to control a gain applied to the received signal, the gain stage producing a scaled signal;

(b) determining an amplitude of the scaled signal;

(c) generating the AGC signal based on the amplitude of the scaled signal and an AGC algorithm, the AGC signal having one of a finite number of possible values;

(d) estimating a DC offset of the scaled signal to generate an estimate;

(e) updating a storage location in a memory means with the estimate; and (f) removing DC offset from the scaled signal using the estimate, wherein the step of estimating the DC offset comprises a step of reading from the memory means a previously stored estimate corresponding to the value of the AGC signal and using the previously stored estimate to set the state of an exponential filter in order to estimate the DC offset of the scaled signal.

29. A software program according to claim 28, wherein the computer-readable medium is resident in a digital signal processor (DSP).

30. A software program according to claim 28, implemented in a wireless hand-held communication device.

31. A software program according to claim 28, implemented in a cellular telephone.

32. A software program according to claim 28, implemented in a personal digital assistant (PDA).

33. A software program according to claim 28, implemented in a two-way pager.

34. A software program according to claim 28, implemented in an Internet appliance.

35. A software program according to claim 28, implemented in an electronic device having means for short-range communication.

36. A wireless communications receiver comprising:
   (a) an antenna for receiving a communication signal;
   (b) a receiver front end comprising means for filtering, amplifying and down-converting the communication signal received by the antenna;
   (c) means for applying a gain to the signal output by the receiver front end to produce a scaled signal, the particular applied gain being controlled by an automatic gain control (AGC) signal;
   (d) in-phase (I) and quadrature (Q) signal component processing means for separating the I and Q components of the scaled signal;
   (e) analog to digital converting (ADC) means for converting the separated I and Q components to digital signals; and
   (f) a digital signal processor (DSP) comprising:
      (i) AGC means for determining amplitude of the I and Q components and generating the AGC signal; and
      (ii) means for estimating a DC offset of the I and Q components to generate a DC offset estimate, wherein the means for estimating the DC offset reads a previously stored DC offset estimate from a memory means and applies the previously stored estimate to set the state of an exponential filter in order to estimate the DC offset of the scaled signal.

37. A wireless receiver according to claim 36, wherein the AGC signal has a finite number of possible values and the means for estimating the DC offset reads a previously stored DC offset estimate corresponding to the value of the AGC signal generated by the AGC means.

38. A wireless receiver according to claim 37, wherein the means for estimating the DC offset of the scaled signal updates the previously stored DC offset value in the memory means.

39. A wireless receiver according to claim 36, the DSP further comprising means for correcting the I and Q components for DC offset using the DC offset estimated by the means for estimating.

40. A wireless receiver according to claim 36, implemented in a wireless modem.

41. A wireless receiver according to claim 36, implemented in a wireless hand-held communication device.

42. A wireless receiver according to claim 36, implemented in a two-way pager.

43. A wireless receiver according to claim 36, implemented in an Internet appliance.

44. A wireless receiver according to claim 36, implemented in an electronic device having means for short-range communication.

* * * * *